(12) United States Patent
Mitsuyoshi

(10) Patent No.: US 6,298,684 B1
(45) Date of Patent: Oct. 9, 2001

(54) SUBSTRATE TRANSFER ROBOT

(75) Inventor: Toshihiko Mitsuyoshi, Fukuyama (JP)

(73) Assignee: Jel Corporation, Fukuyama (JP)

( * ) Notice: Subject to any disclaimer, the term of this patent is extended or adjusted under 35 U.S.C. 154(b) by 0 days.

(21) Appl. No.: 09/440,276

(22) Filed: Nov. 15, 1999

(30) Foreign Application Priority Data

Jul. 26, 1999 (JP) ................................. 11-210153

(51) Int. Cl.[7] ........................................... F25D 23/12
(52) U.S. Cl. ................................. 62/337; 414/939
(58) Field of Search ........................... 62/337, 320, 237; 414/939

(56) References Cited

U.S. PATENT DOCUMENTS

| 1,621,742 | * | 3/1927 | Kessler | ................................. | 165/168 |
| 5,960,640 | * | 10/1999 | Teppke | ................................. | 32/320 |
| 6,086,294 | * | 7/2000 | Danchine et al. | ................... | 409/132 |

FOREIGN PATENT DOCUMENTS 11-87463    3/1999   (JP) .

* cited by examiner

Primary Examiner—Ronald Capossela
(74) Attorney, Agent, or Firm—Kanesaka & Takeuchi

(57) ABSTRACT

A substrate transfer robot has arms 10, 20, 28 to be arranged in high-temperature vacuum atmosphere. To effectively cool the arms, a cooling block 30 having a cooling line P formed therein for circulating coolant is fixed to a first arm 10, as one of the arms 10, 20, 28 which are accommodated in a transfer chamber 2 of which inside is in a vacuum atmosphere. A driving shaft 11 for driving the first arm 10 is provided with a feed passage 13A and a return passage 13B formed along the axial direction thereof for supplying and collecting the coolant to and from the cooling line P of the cooling block 30. A swivel joint 40 is provided on the lower end of the driving shaft to allow the connection between the passage to an external cooling circulating means 8 even when the driving shaft 11 is rotated.

11 Claims, 11 Drawing Sheets

SUBSTRATE TRANSFER ROBOT

BACKGROUND OF THE INVENTION

1. Field of the Invention

The present invention relates to a substrate transfer robot and, more particularly, to a substrate transfer robot which can efficiently cool its arms, of which temperature normally rises during operation because the arms are arranged in high-temperature vacuum atmosphere.

2. Description of a Related Art

In recent years, semiconductor processing equipment which performs sheet-fed processing not batch processing has been mainly employed because such equipment can satisfy demands of enhancing the accuracy of wafer products and improving the throughput. FIG. 1(a) is a schematic plan view showing an example of the construction of a sheet-fed processing equipment 150. FIG. 1(b) is a partial sectional side view thereof. The sheet-fed processing equipment 150 comprises a transfer chamber 151 having hexagonal plan view, and a plurality of loading air locks 152 and a plurality of process chambers 153 (only parts thereof are shown) are connected to the transfer chamber 151 via connecting flanges 158 such that the loading air locks 152 and the process chambers 153 are arranged radially about the transfer chamber 151. These chambers 151, 153 are sealed with high tightness by shut-off valves 154 provided on the connecting flanges 158 and are vacuumed of a high degree by a vacuum pump, not shown. Treatments for wafers are all performed in a vacuum atmosphere.

Each loading air lock 152 receives a cassette 171 in which wafers processed or to be processed are accommodated. Disposed in the process chambers 153 are respective devices (not shown) for processing the wafers. In the sheet-fed processing equipment 150, the wafers are transferred among a plurality of the process chambers 153 whereby the wafers are continuously subjected to a plurality of processes.

The construction of the substrate transfer robot 160 will be described in detail with reference to FIGS. 2, 3. A sectional view of FIG. 2 shows the substrate transfer robot 160 of a three-axial cylindrical coordinate type, with a part being broken away for illustrating the inside construction thereof. FIG. 3 is a plan view showing arms accommodated inside the transfer chamber 151. Shown in FIGS. 2, 3 is the substrate transfer robot in a state that the end of an end effector 163 as one of the arms extends into the process chamber, not shown, adjacent to the transfer chamber 151 via the connecting flange 158.

The substrate transfer robot 160 is fixed to an opening 151a formed in the bottom of the chamber via a attachment flange 155 such that the arms are positioned within the transfer chamber 151. The transfer chamber 151 is a polygonal-column-shaped vessel and has a roof plate 156 on the top thereof to keep air tightness. The substrate transfer robot 160 comprises, as shown in FIG. 3, a first arm 161, a second arm 162 which is attached to the end of the first arm 161 and is rotatable independently of the rotation of the first arm 161, and the end effector 163 which is attached to the end of the second arm 162. Therefore, the substrate transfer robot 160 can perform the forward and reverse rotation ($\theta$) about the center of a robot shell 165, the radial movement (R) of each arm end with the rotation of each arm by the rotation of the rotational axis of the arm transferred through a transmission housed in the arm, and the vertical movement of each driving shaft (see FIGS. 1(a), 1(b)).

As shown in FIG. 2, predetermined rotation is applied to the arms 161, 162, and the end effector 163 of the substrate transfer robot 160 by driving shafts 167, 168 which are arranged coaxially to each other. The rotation of a drive motor (not shown) arranged within the robot shell 165 is transmitted to the driving shaft 167, 168 through a reduction gears (not shown) in a lower bearing box 166. The first driving shaft 167 is a solid steel shaft and is housed in the second driving shaft 168 of a hollow tube type. The second driving shaft 168 of a hollow tube type is arranged coaxially with the central axis of the robot shell 165 to rotate independently of the first driving shaft 167. The upper end of the first driving shaft 167 extends through an upper bearing portion 169 for the first arm 161 and is fixed to a bearing flange (not shown) of the first arm 161. Therefore, the rotation of the first driving shaft 167 is directly transmitted to the first arm 161, thereby rotating the first arm 161 corresponding to the rotational angle of the first driving shaft 167.

On the other hand, the driving transmitting mechanisms of the second arm 162 and the end effector 163 will now be described, but not shown. Fixed to the upper end of the second driving shaft 168 positioned outside of the bearing flange of the first driving shaft 167 is a timing pulley. A timing belt (not shown) is disposed inside the first arm 161 and is stretched between the timing pulley and the rotational shaft of the second arm 162. As the first driving shaft 167 is rotated independently of the second driving shaft 168 to rotate the first arm, the rotational shaft of the second arm 162 is rotated through the timing pulley fixed to the second driving shaft 168 and the timing belt inside the first arm. Therefore, the second arm 162 can be rotated in the reverse direction at a ratio of 1:2 to the rotational angle of the first arm 161 i.e. by double the angle of the first arm 161. Outside of the rotational shaft of the second arm 162, another timing pulley is fixed to the first arm 161 independently of the rotational shaft of the second arm 162. The timing pulley drives the end effector 163 at the end of the second arm 162 through a belt. The rotation of the timing pulley is transmitted to a rotational shaft at the other end of the second arm 162 through the timing belt within the second arm 162 so as to rotate the rotational shaft. The rotation of the rotational shaft moves the end effector 163 fixed to the rotational shaft along a straight line in the transferring direction. The arms structured as stated above are operated according to sequential control. A sequence of operation for the linear transference of the wafers between the loading air lock and the process chamber can be performed.

By the sequential control with the original position where the second arm is superposed on the first arm, the arms and the end effector perform the respective rotation and the telescopic movement whereby the wafers (not shown) can be transferred between the predetermined chambers by the adsorption at the end of the end effector. During this, the valve 154 (see FIG. 1(b)) is opened or closed when the end effector passes the connecting flange 158. Though, for example, a chemical vapor deposition (CVD) process among the substrate processes is performed in relatively low-temperature atmosphere (350–600° C.), a diffusion process may be performed in high-temperature atmosphere about 1200° C. During this process, the end of the second arm and the end effector extending in the process chamber are subjected to radiant heat from the heat source so that heat is stored in the end effector and the arms, increasing their temperature.

Conventionally, to prevent the increase in the temperature of the arms, insulating reflectors for heat reflection are attached on outside walls of the arms. This prevents the arms from being subjected directly to radiant heat, thus preventing the temperature increase in the arms. When the temperature for the process is 1000° C. or more, however, the reflectors as the cooling mechanism become high temperature, not preventing the increase in the temperature of the arms.

The driving shafts for the arms are supported by bearing means such as ball bearings. That is, the driving shafts are connected to the retainer side by point or line contacts with movable bodies such as a plurality of steel balls, rollers, or the like in the bearings. Unlike the normal atmosphere, thermal emission is performed only by heat conduction or radiation in the vacuum atmosphere, so that the efficiency of heat transfer at the point or line contacts of the bearings is quite poor in the case of this construction. Accordingly, heat is hardly emitted from the arms and easily remains in the arms.

To solve this problem, a cooling construction can be thought in which the arms close to the heat source is directly cooled by coolant. That is, in the construction, a circulating piping for the coolant is provided for the moving elements of the arms.

However, to provide such a circulating piping for the coolant in the vacuum atmosphere, it is required to prevent leakage of coolant at joints and pipings. This makes the construction complex and increase the product cost. In addition, it is hard to make the cooling construction to have compact size. Because the pipings should be made of flexible material, problems with regard to the durability occurs, for example, leakage of coolant.

Therefore, it is an object of the present invention to solve the problems of the conventional technique as stated above and to provide a substrate transfer robot in which arms operating in high-temperature vacuum atmosphere are securely cooled.

SUMMARY OF THE INVENTION

For achieving the above object, the present invention provides a substrate transfer robot having arms which are accommodated inside a transfer chamber in a vacuum atmosphere, wherein the rotation and stretch of the arms can transfer a substrate placed on an end of the arm into a process chamber in high-temperature vacuum atmosphere. The substrate transfer robot further comprises a cooling block which is fixed to a first arm among the arms and has a cooling passage formed inside thereof for circulating coolant; a driving shaft for driving the first arm which is provided with a feed passage and a return passage formed inside thereof along the axial direction for supplying and collecting the coolant to and from the cooling block; and a rotary joint which is provided on the lower end of the driving shaft and is capable of connecting the passages to an external coolant circulating means even when the driving shaft is rotated.

The present invention also provides a substrate transfer robot having arms which are accommodated inside a transfer chamber in a vacuum atmosphere, wherein the rotation and stretch of the arms can transfer a substrate placed on an end of the arm into a process chamber in high-temperature vacuum atmosphere, the substrate transfer robot comprising: a cooling block for cooling one of the arms which is fixed to a stationary portion of the transfer chamber and has a cooling passage formed inside thereof for circulating coolant; and a feed passage and a return passage for supplying and collecting the coolant to and from the cooling block.

The present invention also provides a substrate transfer robot having a rotatable base and a linear arm disposed on the base, which are accommodated inside a transfer chamber in a vacuum atmosphere, wherein the rotation of the base and the linear reciprocating motion of the linear arm can transfer a substrate placed on an end of the arm into a process chamber in high-temperature vacuum atmosphere. The substrate transfer robot comprises a cooling block which is arranged to contact a radiating portion of the linear arm and has a cooling passage formed inside thereof for circulating coolant; a driving shaft for rotating the base which is provided with a feed passage and a return passage formed inside thereof along the axial direction for supplying and collecting the coolant to and from the cooling block; and a rotary joint which is provided on the lower end of the driving shaft and is capable of connecting the passages to external coolant circulating means even when the driving shaft is rotated.

It is preferable that the cooling block has a continuous cooling passage for circulating the coolant and that the cooling passage comprises a plurality of through holes formed in the cooling block and is formed by closing the through holes at several points.

It is preferable that the through holes are closed at several points by steel balls.

It is preferable that the cooling block has a cooling passage for circulating the coolant and that the cooling passage comprises a continuous groove formed in the surface of the cooling block and a closing plate attached to the surface of the cooling block to cover the continuous groove.

The substrate transfer robot preferably further comprises a heat absorbing flange on a part of the cooling block wherein the heat absorbing flange comes in contact with a part of a second arm rotatably connected to an end of the first arm.

It is preferable that the second arm is covered by a heat reflecting cover.

The substrate transfer robot preferably further comprises a silicone rubber which is disposed between the second arm and the heat absorbing flange when they are in contact with each other.

It is preferable that said rotary joint is a swivel joint.

DETAILED DESCRIPTION OF THE PREFERRED EMBODIMENTS

With reference to the accompanying drawings, embodiments of a substrate transfer robot of the present invention will be described.

Figure 1A:
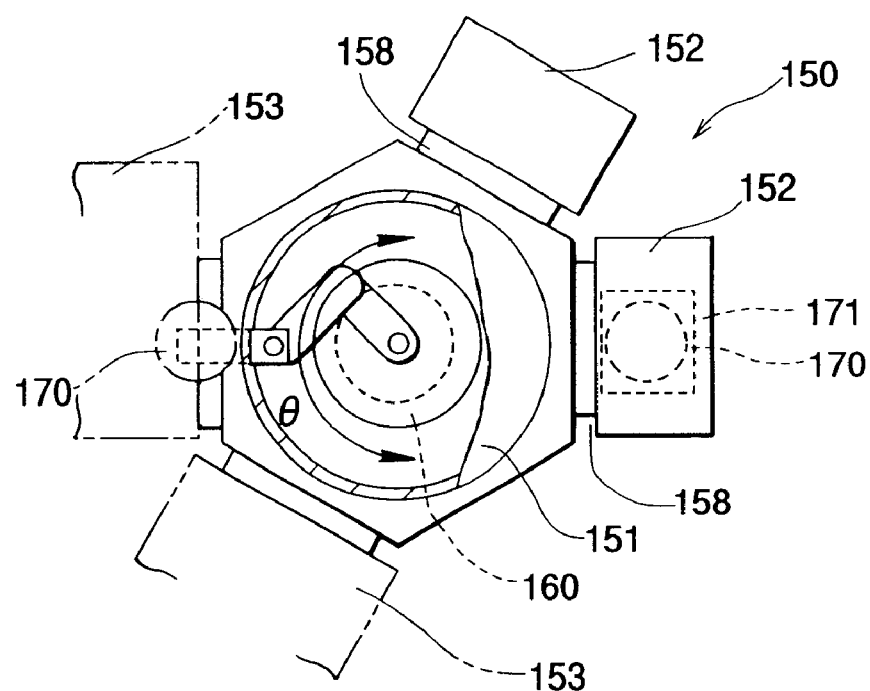
FIG. 1(a) is a plan view showing an example of a conventional sheet-fed processing equipment, with a part being broken away for explaining a transfer chamber and a substrate transfer robot.
Figure 1B:
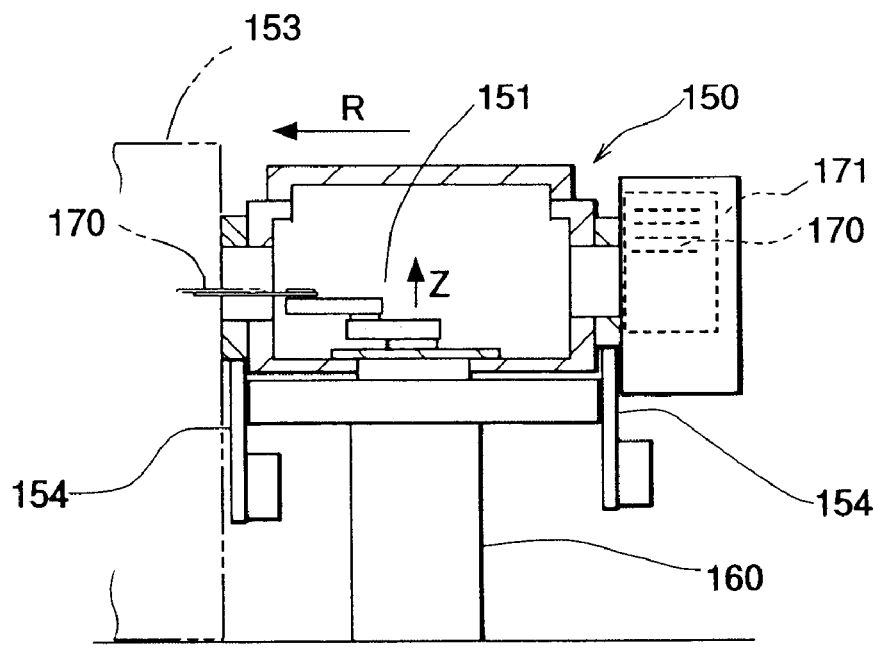
FIG. 1(b) is a side view of the equipment shown in FIG. 1(a)
Figure 2:
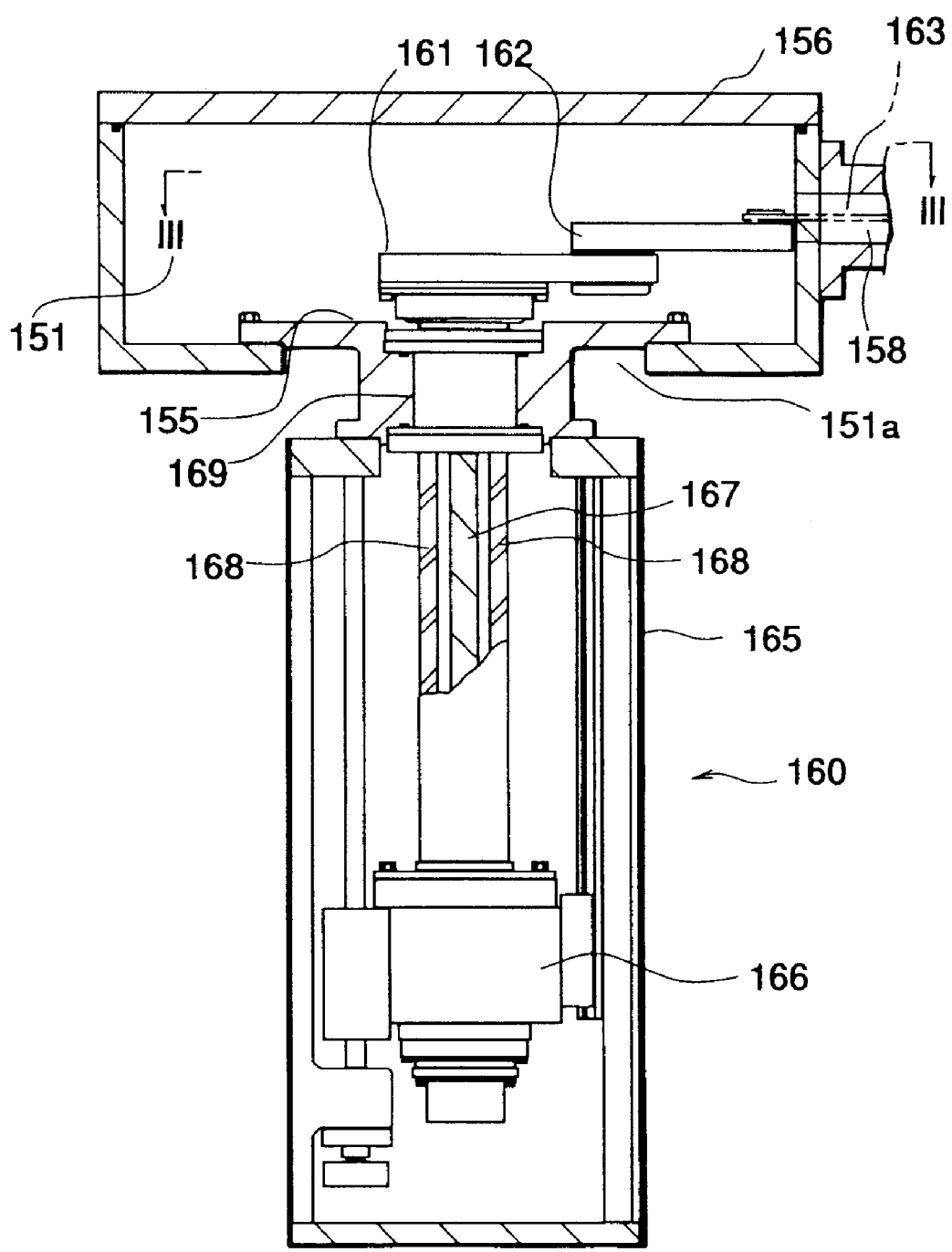
FIG. 2 is a partial sectional view showing an example of the conventional substrate transfer robot.
Figure 3:
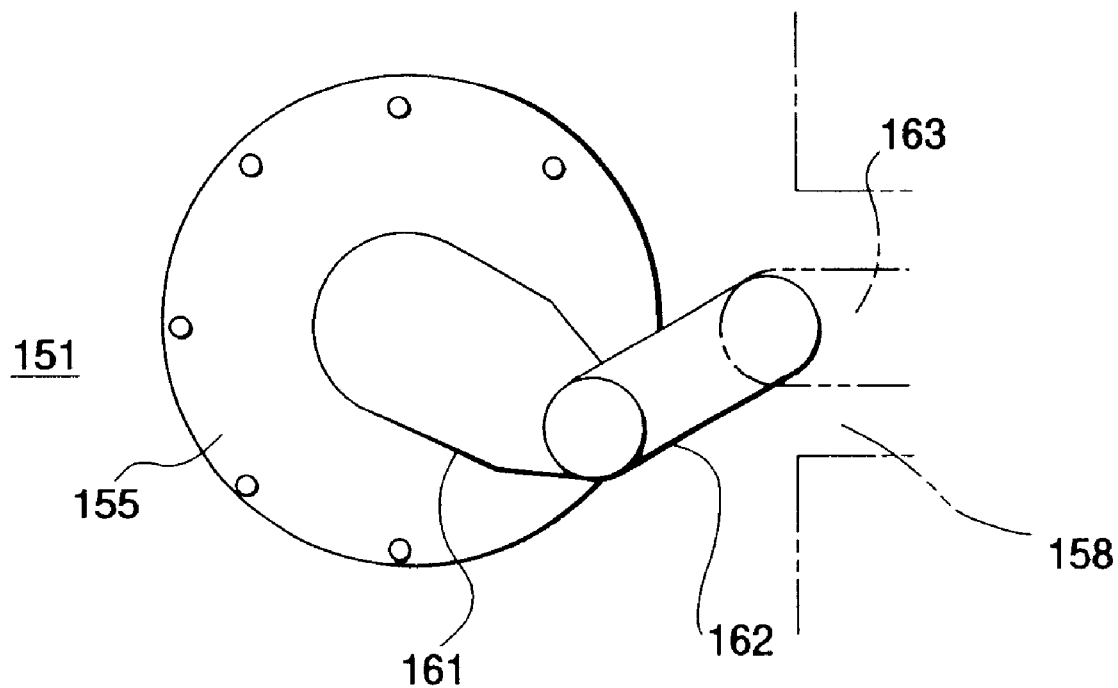
FIG. 3 is a plan view showing arms taken along a line III—III of FIG. 2.
Figure 4:
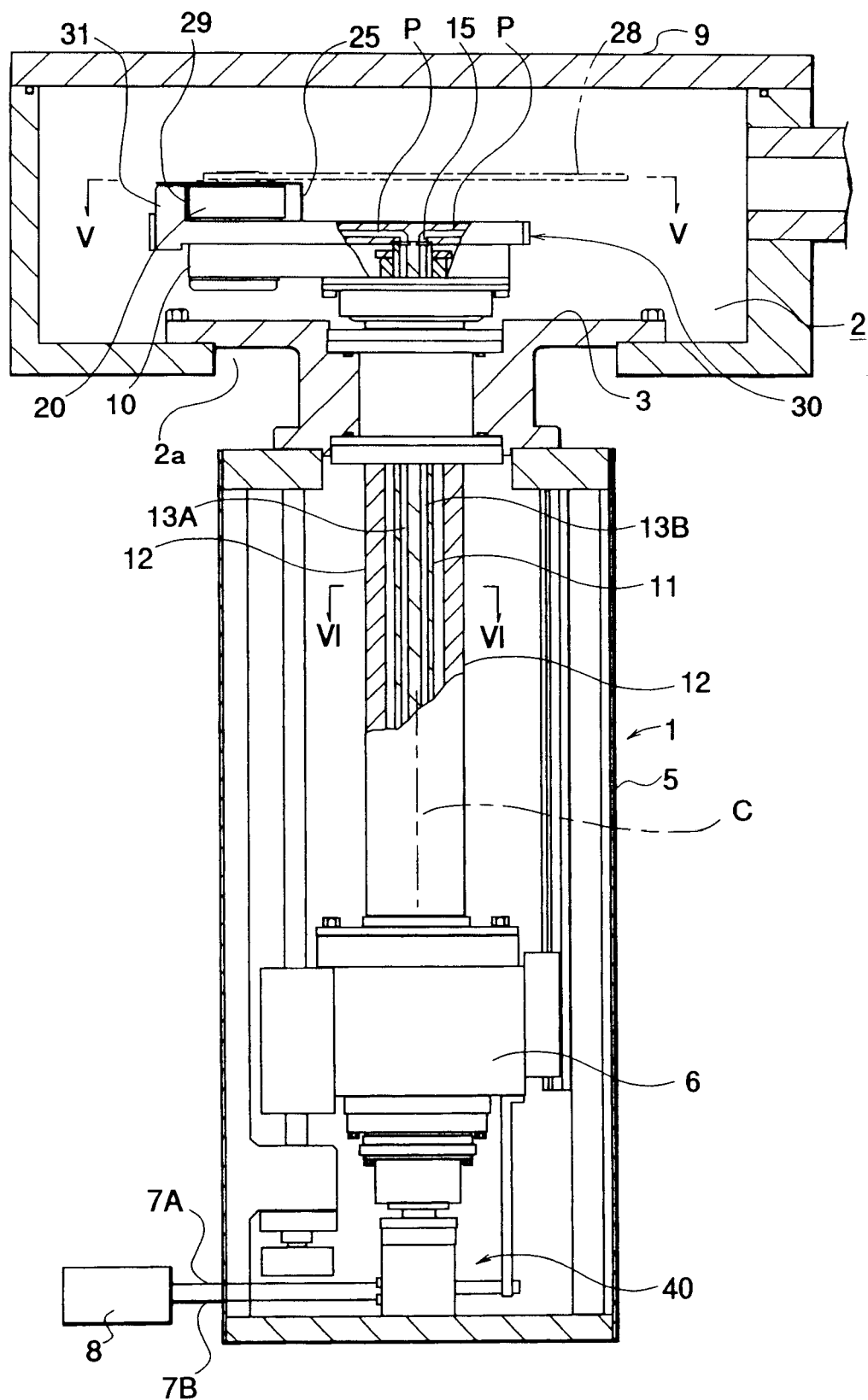
FIG. 4 is a partial sectional view showing an example of a substrate transfer robot according to the present invention.
Figure 5:
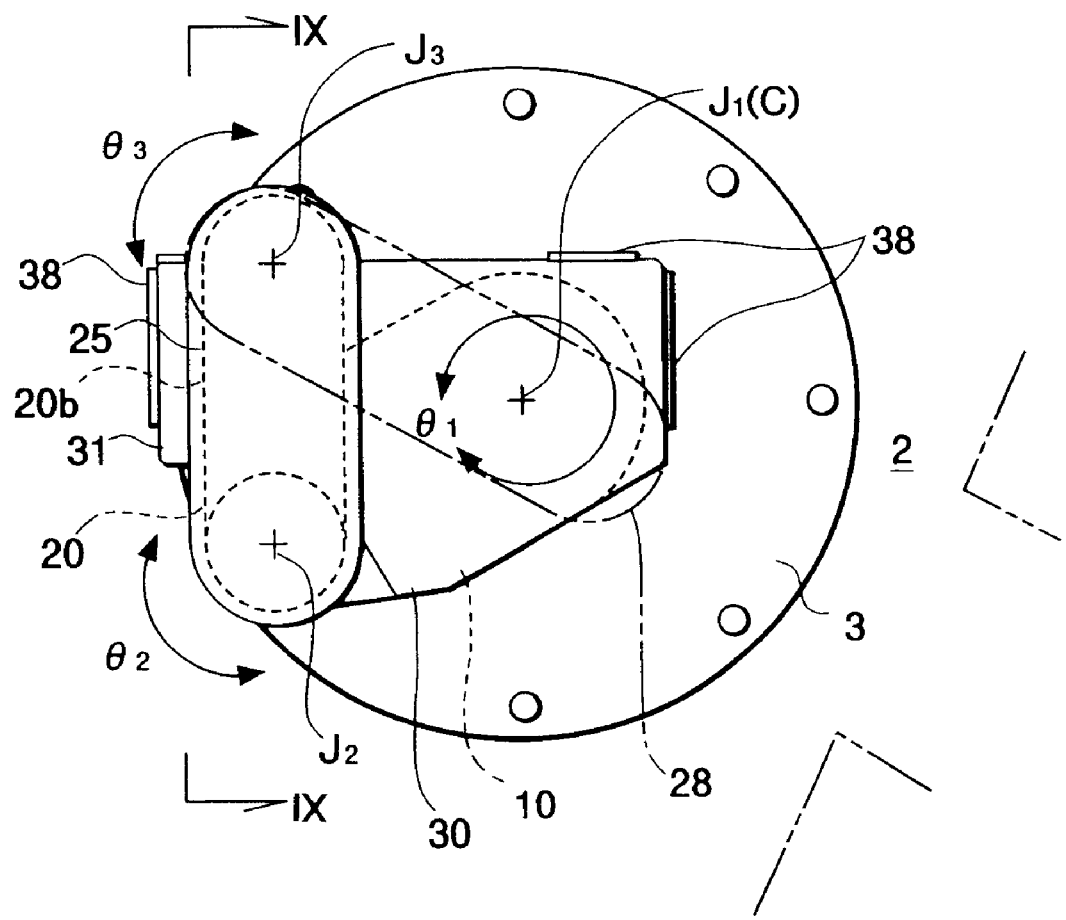
FIG. 5 is a plan view showing arms taken along a line V—V of FIG. 4.

FIG. 4 is a partially sectional view showing the inside construction of a substrate transfer robot 1 of a three-axial cylindrical coordinate type accommodated in a transfer chamber as a sheet-fed processing equipment. FIG. 5 is a plan view (taken along a line V—V shown in FIG. 4) showing arms and a cooling block in the transfer chamber.

The substrate transfer robot 1 is fixed to an opening 2a formed in the bottom of the transfer chamber 2 via an attachment flange 3 such that the arms are positioned within the transfer chamber 2. The transfer chamber 2 is a polygonal-column-shaped vessel and has a roof plate 9 on the top thereof to keep air tightness. The substrate transfer robot 1 comprises, as shown in FIG. 5 with numerals, a first arm 10 which is rotatable by a predetermined rotational angle ($\theta_1$) about a first joint $J_1$, a second arm 20 which is disposed at the end of the first arm 10 and is rotatable by a rotational angle ($\theta_2$) about a second joint $J_2$ independently of the rotation of the first arm 10, an end effector 28 which is attached to the end of the second arm 20 and is rotatable by a rotational angle ($\theta_3$) about a third joint $J_3$, and a cooling block 30 in which a lower surface is fixed to the first arm 10 and a heat absorbing flange 31 disposed at its side is in contact with the second arm 20 so as to cool the second arm 20 subjected to high temperature. The actions of the aforementioned arms are performed by the forward and reverse rotation ($\theta$) of each of two driving shafts 11, 12 provided coaxially with the central axis of a robot shell 5, the telescopic movement (R) of each arm end with the rotation of each arm by the rotational force transferred through a transmission provided at the end of each driving shaft, and the vertical movement (z)of the driving shafts. The first joint $J_1$, is positioned on the central axis C of the robot shell so that the first arm 10 can slew about the central axis C of the robot.

The arms of the substrate transfer robot 1 as shown in FIG. 4 are aluminum slewing arms to which predetermined rotation is applied by the two driving shafts 11, 12 coaxially arranged and driven by a drive motor (not shown) provided near a lower bearing portion 6 of the robot shell 5. The first driving shaft 11 is a solid steel shaft. The second driving shaft 12 is formed in a hollow tube configuration so that the first driving shaft 11 is coaxially arranged therein to have a certain clearance therebetween. Therefore, the rotation of the first driving shaft 11 is directly transmitted to the first arm 10, thereby rotating the first arm 10 corresponding to the rotational angle of the first driving shaft 11. The upper end of the first driving shaft 11 passes through a bearing flange for the first arm 10 and fixed to the lower surface of the cooling block 30. The cooling block 30, as will be described later, is secured to the upper surface of the first arm 10 by bolts (not shown). Therefore, the cooling block 30 can slew integrally with the first arm 10. The material for the arms may be stainless steel or other alloy instead of aluminum.

Figure 6:
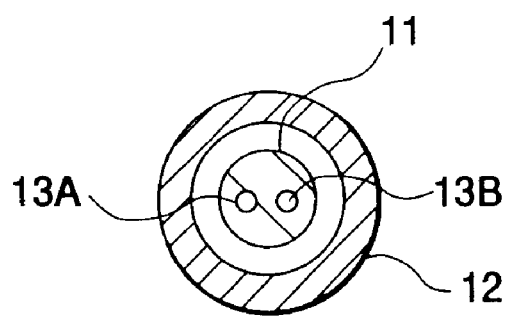
FIG. 6 is a sectional view of a driving shaft taken along a line VI—VI of FIG. 4.

The lower end of the first driving shaft 11 extends to a swivel joint 40 (as will be described later) disposed at the lower end of the robot 1. As shown in FIG. 4 and FIG. 6, two through holes 13A, 13B are formed in the first shaft 11 to extend parallel to the axial direction throughout the first shaft 11. The through holes 13A, 13B are used as a feed passage 13A and a return passage 13B for coolant for circulation in the cooling block 30 and extend to an external coolant circulatory unit 8 via the swivel joint 40 and through passages 7A, 7B such as metallic hoses. On the other hand, the upper end of the first driving shaft 11 is connected to an opening of a cooling path under the cooling block 30.

The mechanism of rotating the second arm 20 is substantially the same as the conventional one. Fixed to the upper end of the second driving shaft 12 positioned outside of the bearing flange for the first driving shaft 11 is a timing pulley. A timing belt (not shown) is disposed inside the first arm 10 and is stretched between the timing pulley and the rotational shaft of the second arm 20. As the first driving shaft 11 is rotated independently of the second driving shaft 12 to rotate the first arm, the rotational shaft of the second arm 20 is rotated through the timing pulley fixed to the second driving shaft 12 and the timing belt inside the first arm 10. Therefore, the second arm 20 can be rotated in the reverse direction at a ratio of 1:2 to the rotational angle of the first arm 10 i.e. by double the angle of the first arm 10. Outside of the rotational shaft of the second arm 20, another timing pulley is fixed to the first arm 10 independently of the rotational shaft of the second arm 20. The timing pulley drives the end effector 28 at the end of the second arm 20 through a belt. The rotation of the timing pulley is transmitted to a rotational shaft at the other end of the second arm 20 through the timing belt within the second arm 20 so as to rotate the rotational shaft. The rotation of the rotational shaft causes a linear movement of the end effector 28 fixed to the rotational shaft.

Figure 7:
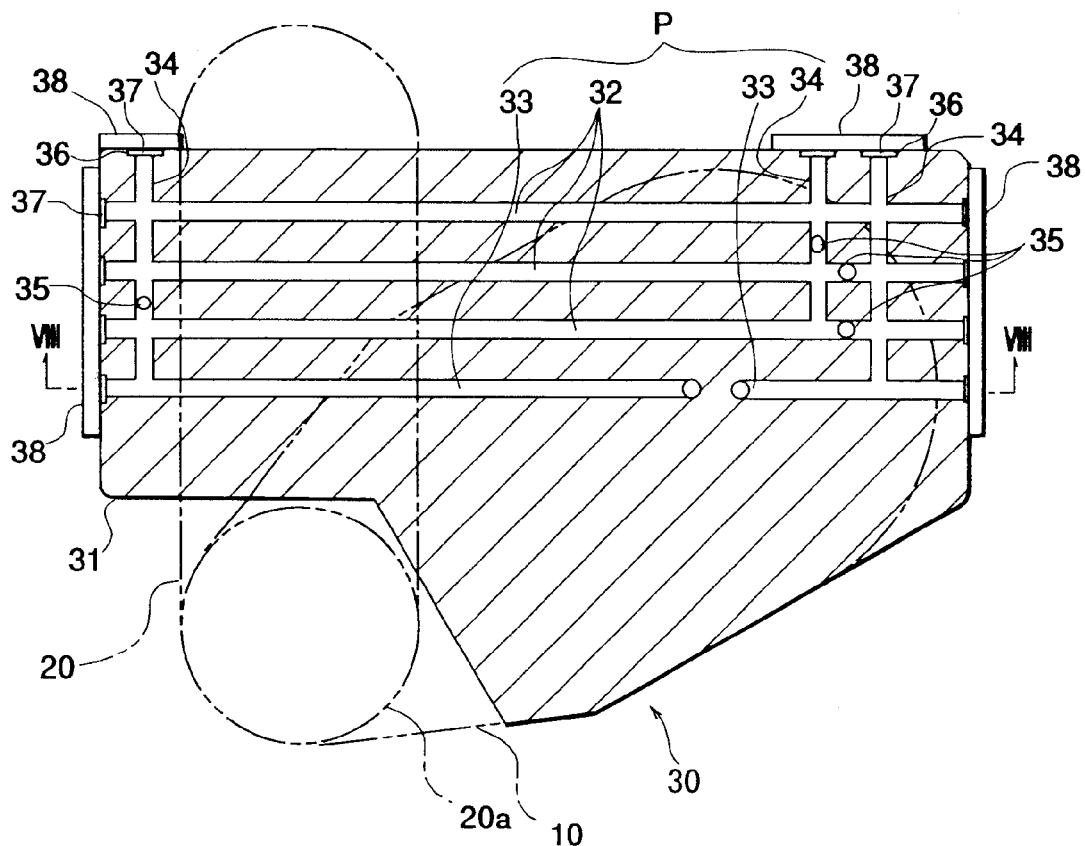
FIG. 7 is a sectional plan view of a cooling block according to the present invention.
Figure 8:
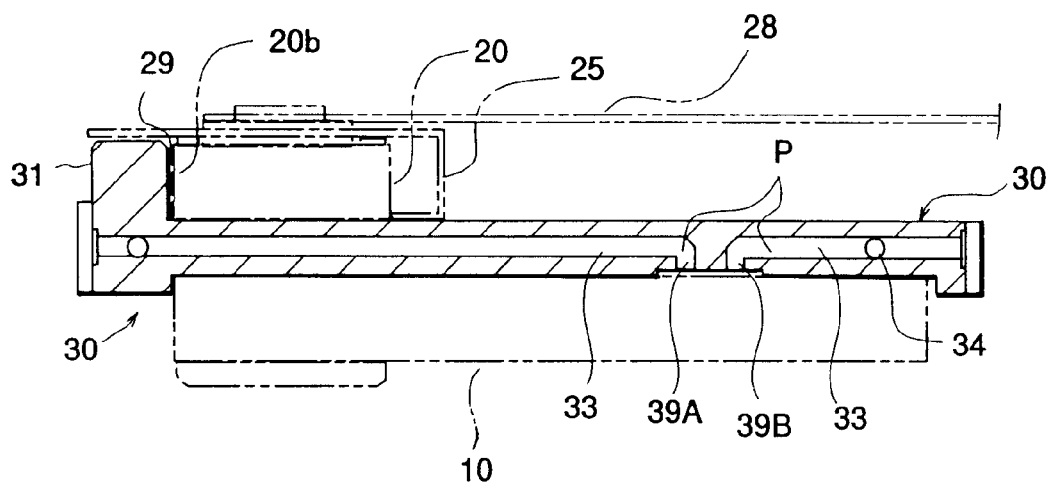
FIG. 8 is a sectional view of a cooling block taken along a line VIII—VIII of FIG. 7.

The construction of the cooling block 30 will be described with reference to FIG. 7 and FIG. 8. The cooling block 30 is composed of a polygonal aluminum plate in such a manner as to cover the first arm 10 but a portion about the rotational shaft of the second arm 20 at the end of the first arm 10. The cooling block 30 has a heat absorbing flange 31 as shown in FIG. 8. When the arms are waiting in the original position, a side surface 20b of the second arm 20 is in contact with the side surface of the heat absorbing flange 31. Though the aluminum plate employed in this embodiment is 18 mm in thickness, it is preferable that the thickness of the aluminum plate is selected to exhibit its cooling capacity corresponding to the specification of the robot and the sizes of the arms.

The cooling block 30 is provided with three horizontal cooling through holes 32 parallel to each other extending between the parallel sides of the cooling block 30 to have openings on the side surfaces of the cooling block 30 and two end cooling through holes 33 parallel to the horizontal cooling through holes 32 having respective openings on the side surfaces and the bottom surface of the cooling block 30. The cooling block 30 is further provided with connecting through holes 34 extending perpendicular to the cooling through holes 32, 33 to have openings on the side surface of the cooling block 30. The cooling through holes 32, 33 and the connecting through holes 34 are drill holes having the same inner diameter ($\phi$6 mm). Steel ball plugs 35 of which the diameter is substantially the same as the inner diameter of the drill holes are arranged at predetermined positions. Concavities 37, on which O-rings are fitted, are formed at the openings on the side surfaces and the bottom surface of the cooling block 30, respectively. Attached on the side surfaces are closing plates 38 for closing the openings on the side surfaces. Steel ball plugs 35 are arranged and fixed as shown in FIG. 7 and the openings on the side surfaces are closed by the closing plates 38 so as to form a continuous cooling passage P comprising the cooling through holes 32, 33 and the connecting through hole 34. Therefore, two openings 39 on the bottom surfaces function as an inlet 39A and an outlet 39B of the continuous cooling passage P. It is preferable that the inner diameter of the cooling through hole, the length (number) of extensions of the cooling passage, and the layout are designed corresponding to the cooling capacity of the cooling block 30 defined by the thermal design.

To form the cooling passage P in another method, an aluminum plate of 12 mm in thickness is employed and a cooling passage P is formed by cutting out a continuous groove as a continuous turn line in the aluminum plate just like a picture drawn with a single stroke of brush. A plate of 6 mm in thickness is attached close to the surface having the continuous groove formed therein, thereby making a cooling block which can exhibit the same functions and effects.

The upper end of the aforementioned first driving shaft 11 is connected through a leakage preventing means such as an O-ring to a portion of the bottom surface of the cooling block 30 in which the inlet 39A and the outlet 39B are formed. The inlet 39A and the outlet 39B communicate with the feed passage 13A and the return passage 13B, respectively, with keeping air tightness.

Figure 9:
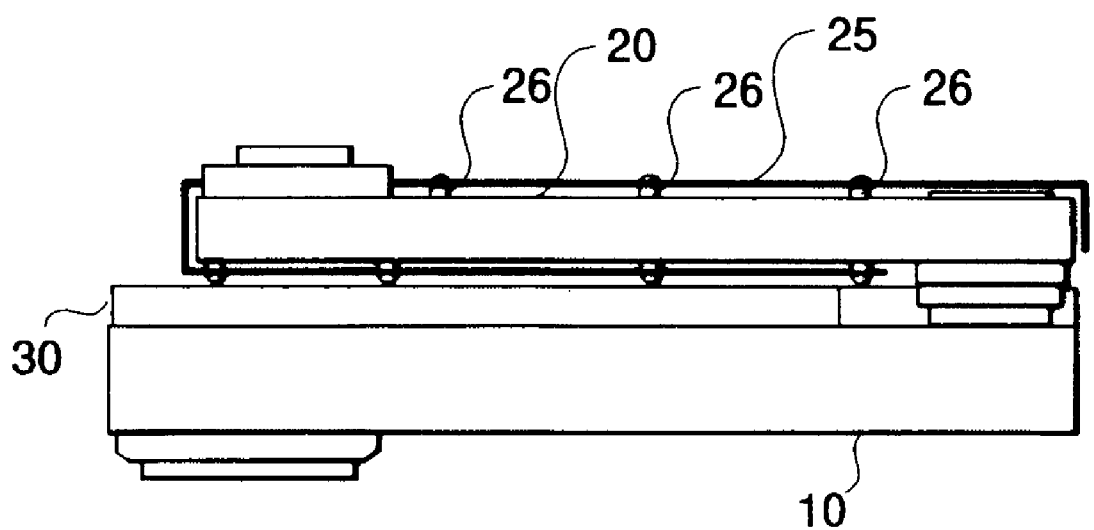
FIG. 9 is a side view showing a second arm and a cover for the cooling block taken along a line IX—IX of FIG. 5.

To prevent the temperature of the second arm 20 moving closer to the heat source (not shown) from increasing, reflective covers 25 are attached to the second arm 20 as shown in FIG. 8, FIG. 9. The reflective covers 25 are made of a polished stainless steel plate (SUS304) covering the upper and bottom surfaces of the second arm 20 and a side surface opposite to the side coming in contact with the cooling block 30. The reflective covers 25 are attached to predetermined positions of the second arm 20 through a ceramic spacer 26 having high heat insulation property.

The construction of the swivel joint 40 connected to the lower end of the first driving shaft 11 will be described with reference to FIG. 10 and FIGS. 11(*a*) and 11(*b*).

Figure 10:
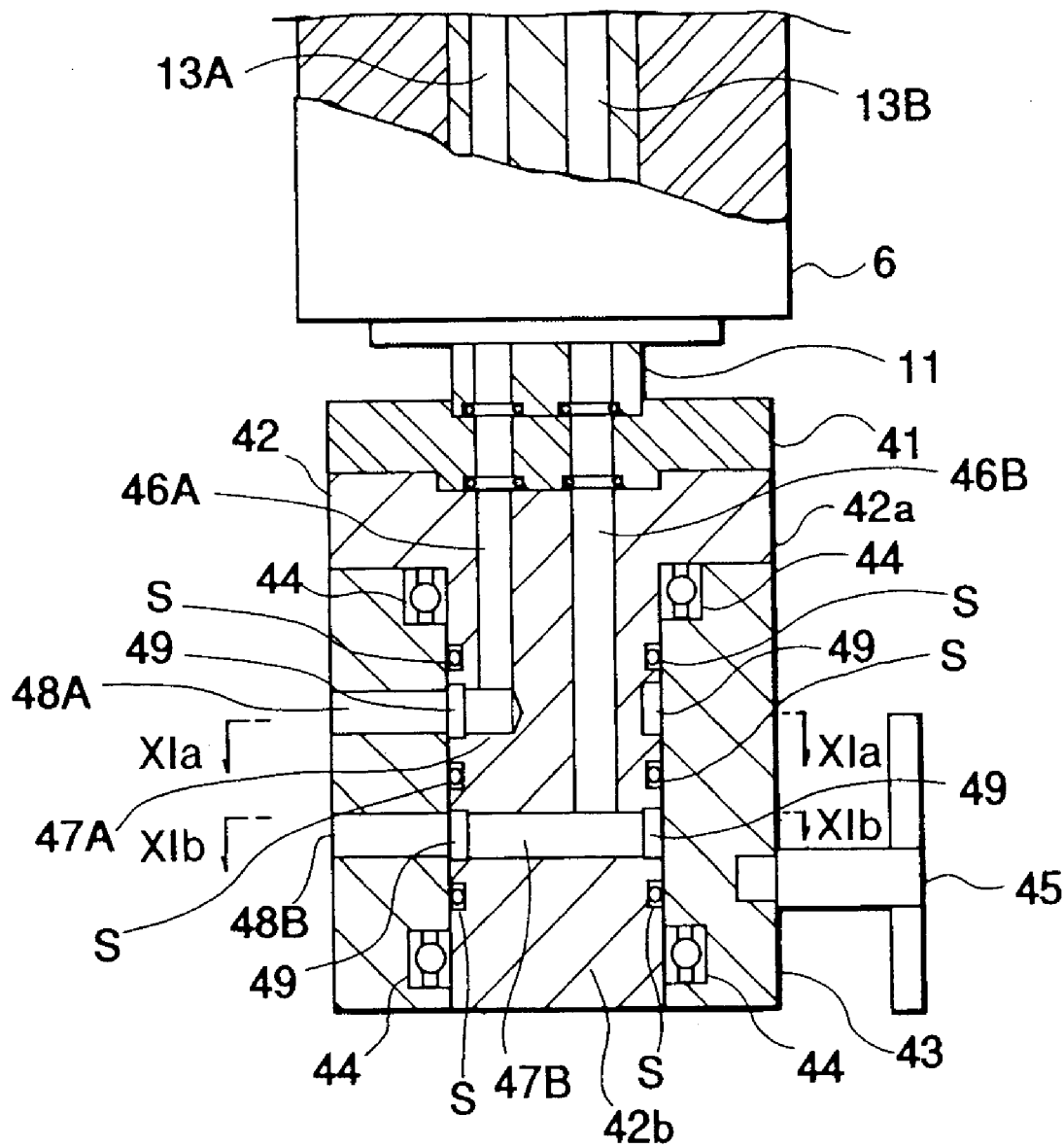
FIG. 10 is a longitudinal sectional view showing the construction of a swivel joint.
Figure 11A:
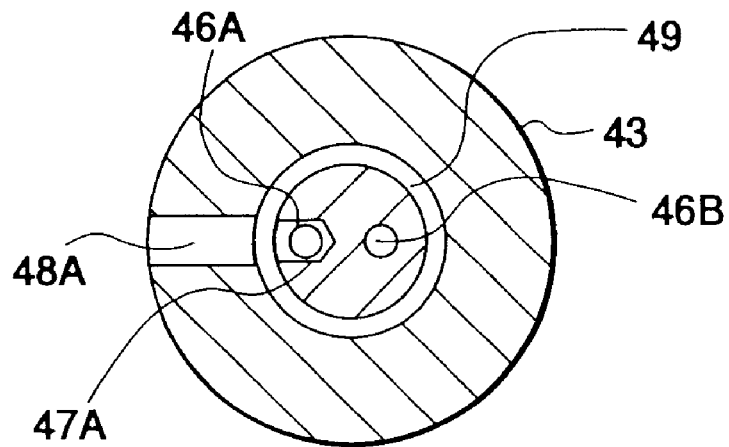
FIGS. 11(a), 11(b) are cross sectional views showing portions including horizontal holes shown in FIG. 10.
Figure 11B:
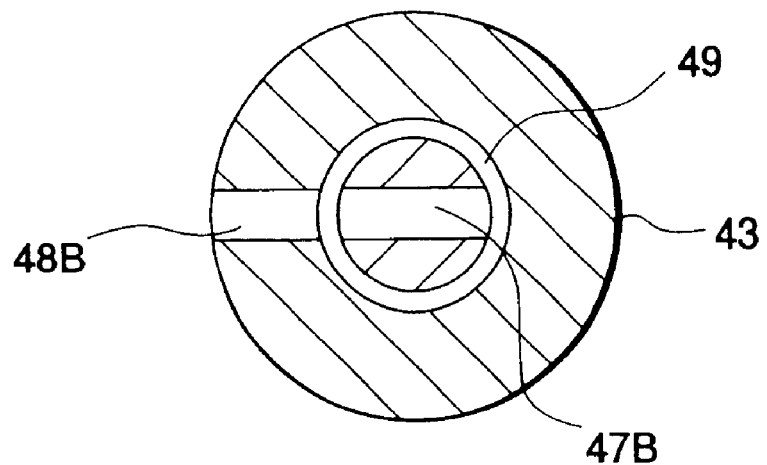
Figure 12A:
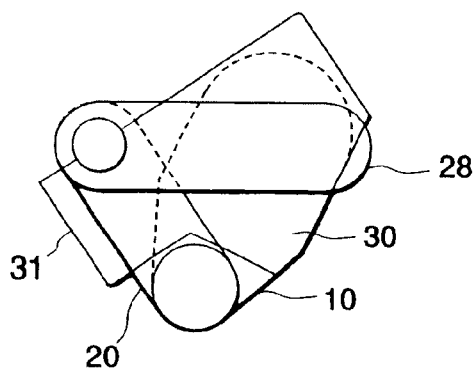
FIGS. 12(a) through 12(d) are views showing a typical movement for explaining the timing of cooling the arms by the cooling block.
Figure 12B:
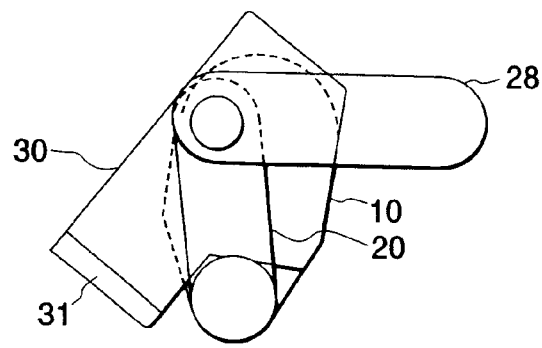
Figure 12C:
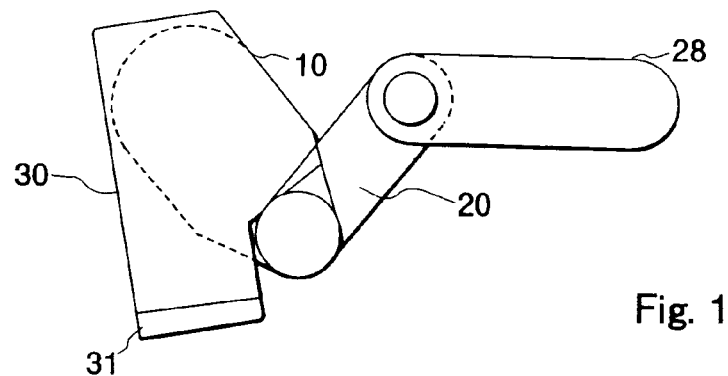
Figure 12D:
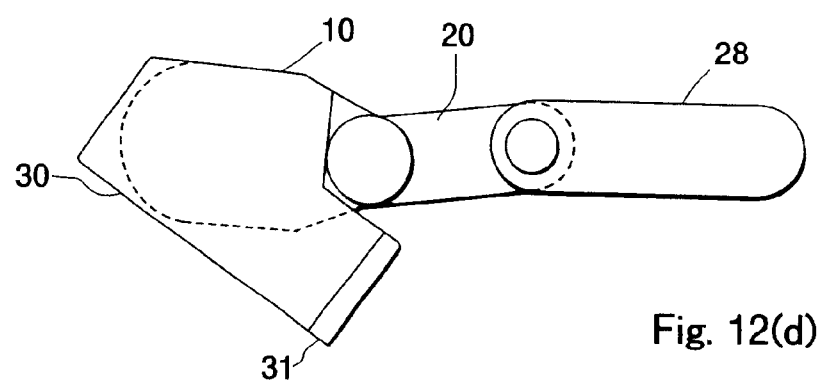

FIG. 10 shows a state where the first driving shaft 11 projects from the lower end of the lower bearing portion 6. A connecting plate 41 is fixed to the lower surface of the first driving shaft 11 by bolts not shown. Fixed to the bottom surface of the connecting plate 41 is a swivel 42. The swivel 42 comprises an upper flange 42*a* and a cylindrical body 42*b* which are integrally formed. The swivel 42 is connected to the connecting plate 41 through the upper flange 42*a* by bolts (not shown) . The cylindrical body 42*b* of the swivel 42 is rotatably supported to an outer housing 43 through ball bearings 44 which are positioned about the upper and lower ends of the outer housing 43. The rotation of the outer housing 43 is restricted by a fixing pin 45 attached to a portion of the outer surface thereof.

In the cylindrical body 42*b*, a feed passage 46A and a return passage 46B for coolant are formed along the axial direction and horizontal through holes 47A, 47B are formed to extend perpendicular to and communicate with the feed passage 46A and the return passage 46B. Also in the cylindrical body 42*b*, square grooves 49 having a width larger than the diameter of the horizontal through holes 47A, 47B are formed at the same levels of the openings of the horizontal through holes 47A, 47B, respectively. Further, valve mounting through holes 48A, 48B are formed in the outer housing 43 at the same levels of the horizontal through holes 47A, 47B, respectively. Therefore, the feed passage 7A and the return passage 7B (see FIG. 4) connected to the external coolant circulatory unit 8 are connected to the swivel joint 40 through the feed end and the return end. Because of the aforementioned structure of the swivel joint 40, even when the first driving shaft 11 is rotated, the coolant can be always supplied through the feed passage 7A into the first driving shaft 11 via the swivel joint 40, be circulated through the aforementioned cooling passage P of the cooling block 30, and be returned to the first driving shat 11. Then, the coolant can be returned to the coolant circulatory unit 8 through the return passage 7B.

To prevent the leakage of the coolant from the sliding parts between the cylindrical body 42*b* and the outer housing 43, sealing portions S are formed on the outer surface of the cylindrical body. As for the structure of the sealing portions S in this embodiment, O-ring receiving grooves are formed at upper and lower positions about the square grooves and O-rings are accommodated in the O-ring receiving grooves, thereby preventing the leakage of the coolant.

With reference to FIG. 4 and FIGS. 12(*a*) through 12(*d*), the method of cooling the arms according to the cooling structure as mentioned above.

The coolant circulatory unit 8 comprises a coolant cooling device (heat exchanger) and a circulating pump, not shown, as main devices which are disposed separately from the substrate transfer robot 1. Suitably employed as the coolant may be water, nitrogen, freon alternative, ammonia, propane, or ethylene. As the coolant circulatory unit 8 in the structure as shown in FIG. 4 is driven, the coolant is circulated through the swivel joint 40, the first driving shaft 11 in the substrate transfer robot 1, and the cooling passage P in the cooling block 30, thereby cooling the cooling block 30 to about 5° C.

The timing for cooling the second arm 20 will be described with reference to the drawings. In FIGS. 4 and 12(*a*), the second arm 20 is in the original position. The side surface 20*b* of the second arm 20 is in contact with the heat absorbing flange 31 of the cooling block 30. Attached to the surface of the heat absorbing flange 31 which is in contact with the second arm 20 is a high heat conductivity silicone rubber plate 29 of a predetermined thickness. The heat of the second arm 20 in which heat is stored and of which temperature is increased is absorbed by the heat absorbing flange 31 through the high heat conductivity silicone rubber plate 29, thereby efficiently decreasing the temperature of the second arm 20. Then, as shown in FIGS. 12(*b*) through 12(*d*), the arms are stretched out according to the predetermined sequential control to convey a wafer (not shown) on the end of the end effector 28 into the process chamber of which temperature is high. Thus, the end effector 28 and the second arm 20 are subjected to radiant heat from the heat source (not shown) so that the temperature of the arms is increased again. In the process of transferring treated wafers, however, the second arm 20 is returned to the original position again so that the second arm 20 comes in contact with the heat absorbing flange 31, which has been cooled again, via the high heat conductivity silicone rubber plate 29 at the original position. Therefore, the second arm 20 is cooled again. In this manner, the second arm 20 having increased temperature comes in contact with the heat absorbing flange 31 of the cooling block 30 with a predetermined interval, thereby achieving the periodic cooling of the second arm 20. The first arm 10 is always in contact with the cooling block 30, thereby minimizing the heat transfer due to the radiation from the second arm 20 to other parts.

Figure 13:
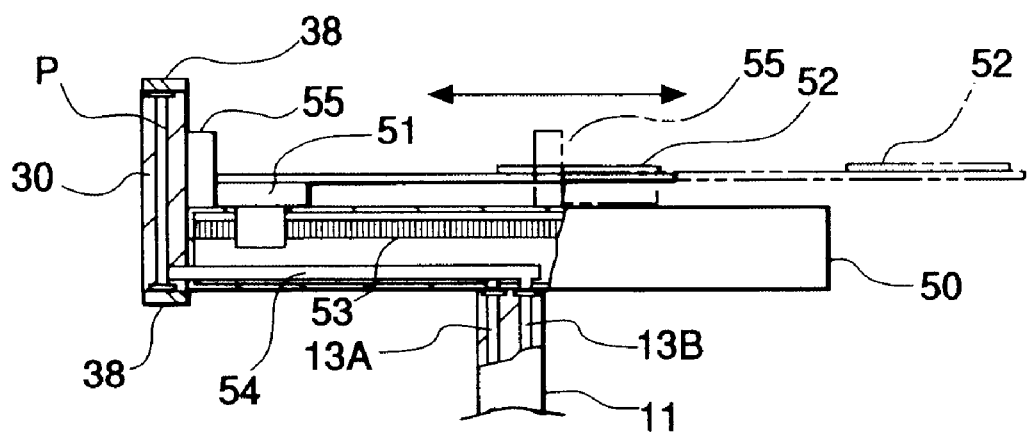
FIG. 13 is a partially sectional side view showing the construction of a cooling block of another embodiment.
Figure 14:
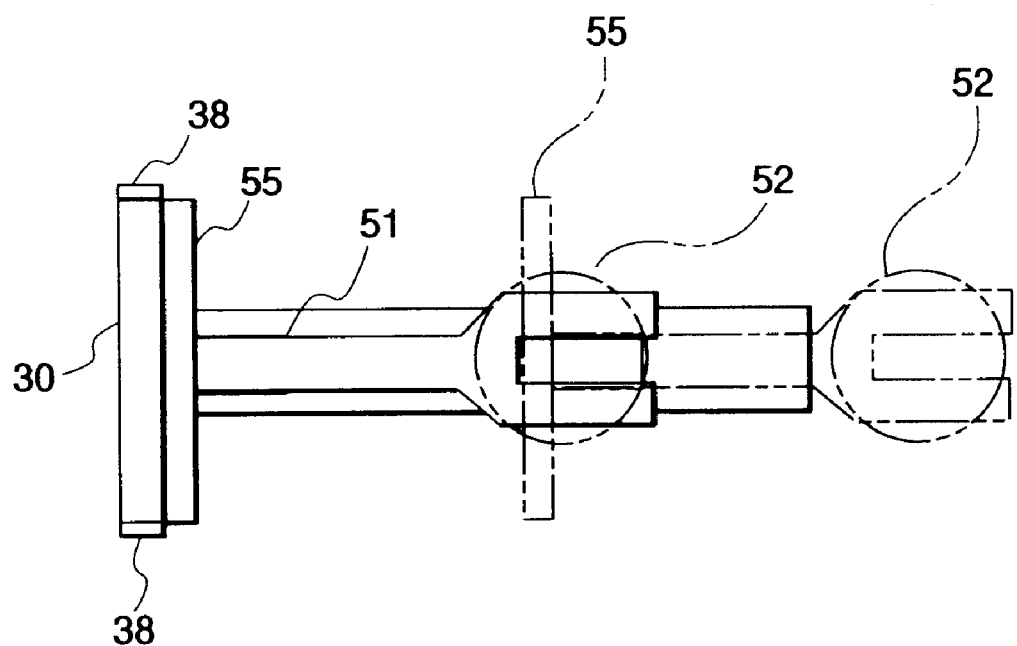
FIG. 14 is a plan view showing the operational state of the cooling block shown in FIG. 13.

FIG. 13 and FIG. 14 are a partial sectional view and a plan view showing, as another embodiment, an example of applying a cooling block construction to be applied to a substrate transfer robot in which a linear arm is employed for the substrate transfer. Parts similar or corresponding to the parts of the substrate transfer robot shown in FIG. 4 will be marked by the same reference numerals. As shown in FIG. 13, accommodated in a rotatable slider base 50 is a ball screw mechanism 53 for moving a slide arm 51 fixed to the nut in a linear direction by the drive of the motor (not shown). The slide arm 51 conducts the linear reciprocating motion in the direction shown by arrows with a substrate 52 such as a wafer being placed on the end thereof. When the slide arm 51 is extended, the substrate 52 is conveyed in the process chamber, not shown, of which the temperature is high. At this point, a radiating plate 55 is formed integrally with the back surface of the slide arm 51. The radiating plate 55 comes in contact with the cooling block 30 attached to the end of the slider base 50. Arranged between the cooling block 30 and the side surface of the radiating plate 55 is a high heat conductivity silicone rubber plate, not shown, so that the temperature of the slide arm 51 and the radiating plate 55 can be decreased because of the contact between the radiating plate and the cooling block 30 via the high heat conductivity silicone rubber plate. The cooling block 30 is provided with a cooling passage P inside thereof which is formed in the same method as shown in FIG. 7. The slide base 50 is provided with pipings 54 inside thereof and the driving shaft 11 is provided with a feed passage 13A and a return passage 13B formed therein.

Though the cooling block 30 and the first arm 10 are rotatable integrally with each other in the above description, a rotary joint such as a swivel joint may be provided between the cooling block 30 and the upper end of the first driving shaft 11 to separate the cooling block 30 from the rotation of the first arm 10 and only the cooling block 30 may be fixed to a stationary portion in the chamber 2. In this case, the first arm 10 can be rotated easily, thereby allowing the employment of a smaller driving unit.

What is claimed is:

1. A substrate transfer robot to be connected to an external coolant circulatory unit, comprising:

first and second arms connected to each other to transfer a substrate and accommodated in a transfer chamber, a cooling block fixed to the first arm and having a cooling passage for circulating coolant therein, a heat absorbing flange integrally formed with the cooling block and contacting a part of the second arm connected to the first arm at one end thereof, a driving shaft connected to the first arm for driving the same, said driving shaft having a feed passage and a return passage therein extending along an axial direction thereof and communicating with the cooling block for supplying and collecting the coolant to and from the cooling block, and a rotary joint attached to a lower end of the driving shaft to communicate with the feed and return passages, said rotary joint being adapted to be connected to the external coolant circulatory unit for providing the coolant to the cooling block and receiving the coolant from the cooling block when the driving shaft is being rotated.

2. A substrate transfer robot as claimed in claim 1, wherein said cooling passage in the cooling block is a continuous passage for circulating the coolant, and includes a plurality of through holes crossing each other formed in the cooling block and closed at several points for forming the continuous passage.

3. A substrate transfer robot as claimed in claim 2, wherein said cooling block includes steel balls disposed in the through holes for closing the through holes.

4. A substrate transfer robot as claimed in claim 1, wherein said cooling passage is formed of a continuous groove formed in a surface of the cooling block and a closing plate attached to the surface of the cooling block to cover the continuous groove.

5. A substrate transfer robot as claimed in claim 1, further comprising silicone rubber disposed between the second arm and the heat absorbing flange when they contact each other.

6. A substrate transfer robot as claimed in claim 1, wherein said transfer chamber is disposed in a vacuum atmosphere; a process chamber to which the transfer robot moves from the transfer chamber is disposed in high-temperature vacuum atmosphere; and said external coolant circulatory unit includes a coolant cooling device and a circulating pump.

7. A substrate transfer robot to be connected to an external coolant circulatory unit, comprising:

first and second arms connected to each other to transfer a substrate and accommodated in a transfer chamber, a cooling block fixed to a stationary portion of the transfer chamber, said cooling block being attached to the first arm and having a cooling passage for circulating coolant therein, a heat absorbing flange integrally formed with the cooling block and contacting a part of the second arm connected to the first arm at one end thereof, and a feed passage and a return passage connected to the cooling block for supplying and receiving the coolant between the cooling block and the external coolant circulatory unit.

8. A substrate transfer robot as claimed in claim 7, wherein said cooling passage in the cooling block is a continuous passage for circulating the coolant, and includes a plurality of through holes crossing each other formed in the cooling block and closed at several points for forming the continuous passage.

9. A substrate transfer robot as claimed in claim 8, wherein said cooling block includes steel balls disposed in the through holes for closing the through holes.

10. A substrate transfer robot as claimed in claim 7, wherein said cooling passage is formed of a continuous groove formed in a surface of the cooling block and a closing plate attached to the surface of the cooling block to cover the continuous groove.

11. A substrate transfer robot as claimed in claim 7, further comprising silicone rubber disposed between the second arm and the heat absorbing flange when they contact each other.

* * * * *